US010128141B2

(12) United States Patent
Tandou et al.

(10) Patent No.: US 10,128,141 B2
(45) Date of Patent: Nov. 13, 2018

(54) PLASMA PROCESSING APPARATUS AND PLASMA PROCESSING METHOD

(71) Applicant: Hitachi High-Technologies Corporation, Minato-ku, Tokyo (JP)

(72) Inventors: Takumi Tandou, Tokyo (JP); Go Miya, Tokyo (JP); Masaru Izawa, Tokyo (JP); Hiromichi Kawasaki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 2 days.

(21) Appl. No.: 14/183,559

(22) Filed: Feb. 19, 2014

(65) Prior Publication Data

US 2014/0283534 A1  Sep. 25, 2014

(30) Foreign Application Priority Data

Mar. 19, 2013 (JP) ................................. 2013-055872

(51) Int. Cl.
*H01L 21/683* (2006.01)
*H01J 37/32* (2006.01)

(52) U.S. Cl.
CPC ........ *H01L 21/683* (2013.01); *H01J 37/3299* (2013.01); *H01J 37/32715* (2013.01); *H01J 37/32724* (2013.01)

(58) Field of Classification Search
CPC .............. H01L 21/683; H01J 37/32715; H01J 37/3299; H01J 37/32724
USPC .......................................................... 62/62
See application file for complete search history.

(56) References Cited

U.S. PATENT DOCUMENTS

| 2008/0023448 A1* | 1/2008 | Tandou | H01L 21/67109 219/121.36 |
| 2009/0277883 A1 | 11/2009 | Tandou et al. | |
| 2010/0126666 A1* | 5/2010 | Tandou | H01J 37/32522 156/345.27 |
| 2012/0186745 A1* | 7/2012 | Miya | H01J 37/32715 156/345.27 |

FOREIGN PATENT DOCUMENTS

| JP | 03-031640 A | 2/1991 |
| JP | 2009-272535 A | 11/2009 |

* cited by examiner

*Primary Examiner* — Orlando E Aviles Bosques
*Assistant Examiner* — Steve Tanenbaum
(74) *Attorney, Agent, or Firm* — Miles & Stockbridge P.C.

(57) ABSTRACT

A plasma processing apparatus includes: a refrigerating cycle including a refrigerant passage, a compressor, and a condenser, all of which are coupled in this order, and through which a refrigerant flows in this order, the refrigerant passage being disposed inside a sample stage and through which the refrigerant flows to serve as an evaporator; first and second expansion valves which are interposed between the condenser and the refrigerant passage and between the refrigerant passage and the compressor respectively in the refrigerating cycle; a vaporizer that is interposed between the second expansion valve and the compressor in the refrigerating cycle and which heats and vaporizes the refrigerant; and a controller which regulates opening and closing of the first and second expansion valves and regulates a refrigerant heat exchange amount of the condenser or vaporizer based on a refrigerant temperature between the condenser and the second expansion valve.

2 Claims, 3 Drawing Sheets

PLASMA PROCESSING APPARATUS AND PLASMA PROCESSING METHOD

BACKGROUND OF THE INVENTION

The present invention relates to a plasma processing apparatus that micromachines a sample such as a wafer in a semiconductor manufacturing process, and more particularly to a temperature control apparatus for a sample stage that holds and fastens a semiconductor wafer.

With a trend of semiconductor device miniaturization, processing precision required for etching a sample is increasing year by year. In order to perform high-precision processing on a fine pattern in a wafer surface by the plasma processing apparatus, it is important to control the wafer surface temperature during etching. In order to meet further increased shape precision in recent years, a temperature control technique is required to rapidly control the wafer temperature to be uniform in-plane depending on an etching step during processing.

In order to control the wafer surface temperature in the plasma processing apparatus, the surface temperature of the sample stage contacting the wafer back surface with a heat transfer medium therebetween may be controlled. A sample stage in the prior art is configured such that a refrigerant passage is formed therein and a liquid refrigerant is introduced into the passage, thereby controlling the temperature of the sample stage surface.

This liquid refrigerant is regulated to a target temperature by a cooling system or a heating system in a refrigerant supply apparatus and then is supplied into the sample stage passage. Such a refrigerant supply apparatus is structured such that the liquid refrigerant is temporarily stored in a tank and undergoes temperature regulation before being discharged. Since the liquid refrigerant itself has a large heat capacity, the refrigerant supply apparatus is effective in maintaining constant wafer surface temperature.

However, the refrigerant supply apparatus has a slow temperature response, a difficulty in rapid temperature control, and a low heat exchange efficiency. Therefore, it is difficult to optimally control the wafer surface temperature as the etching progresses.

In light of this, there has conventionally been proposed a cooling apparatus using a so-called direct expansion system that expands a refrigerant in a refrigerant passage (hereinafter referred to as a direct expansion cooling apparatus) which includes a refrigerant circulating system including a compressor for highly pressurizing a refrigerant, a condenser for condensing the highly pressurized refrigerant, and an expansion valve for expanding the refrigerant, all of which are installed in a sample stage and the refrigerant is evaporated in the refrigerant passage of the sample stage for cooling. The direct expansion technique has advantages: the use of refrigerant evaporation latent heat provides high cooling efficiency and the refrigerant evaporation temperature can be controlled rapidly by pressure.

For example, JP-A-2009-272535 (corresponding to US. Patent Publication No. 2009/0277883A1) discloses a technique for allowing the sample stage to act as an evaporator of a refrigerating cycle and constitute a direct expansion cooling system including a compressor, a condenser, and an expansion valve. The prior art also discloses a method in which the dryness degree of the refrigerant discharged from the sample stage is controlled to prevent the refrigerant dryout (disappearance of a liquid film) from occurring in the refrigerant passage and the sample stage is regulated to an in-plane uniform temperature.

In addition, JP-A-H3-31640 discloses a technique in which an air conditioning apparatus using the direct expansion cooling system allows a desired temperature to be achieved by detecting the temperature to be controlled and controlling the heat exchange amount of the condenser. Specifically, the prior art discloses a technique in which a measured room temperature value is compared with a set room temperature value; and if the measured room temperature value is higher than the set room temperature value, the rotational speed of an outdoor fan is increased to increase the heat exchange amount by an outdoor heat exchanger, thereby maintaining the room temperature at the set temperature.

As described above, the cooling principle of the direct expansion cooling system and refrigerating apparatus uses latent heat released when the refrigerant is evaporated from a liquid to a gas; and the expansion valve opening degree in the cycle can be regulated thereby to regulate the refrigerant pressure and to regulate the evaporation temperature. Note that the refrigerant that absorbs heat from an object to be cooled is increased in enthalpy (amount of heat per 1 kg of refrigerant), undergoes adiabatic compression in the compressor, and the heat is exhausted by the condenser.

At this time, the refrigerant temperature at the sample stage position is changed by an exhaust heat amount of the condenser. In other words, it is also important to appropriately control the exhaust heat capacity of the condenser for temperature control of the sample stage. Meanwhile, JP-A-H3-31640 discloses that in the direct expansion cooling system, the refrigerant temperature control in an evaporator can be controlled not only by the expansion valve opening degree but also by the condenser heat exchange amount.

Other objects, features and advantages of the invention will become apparent from the following description of the embodiments of the invention taken in conjunction with the accompanying drawings.

SUMMARY OF THE INVENTION

Recent temperature control mechanism for the plasma processing apparatus is required to more precisely regulate the wafer temperature to an optimal value depending on each etching step in a process as well as a high temperature response and a wide setting range of available temperature values. In contrast to this, in the prior art described above, consideration is insufficient for the following points, thus causing a problem.

Specifically, the prior art disclosed in JP-A-2009-272535 can achieve a high temperature response by controlling the expansion valve opening degree. However, the prior art is limited in that the temperature setting range is relatively narrow because the heat exchange amount in the condenser is constant.

In addition, if the heat exchange amount in the condenser is not controlled, the prior art does not consider that the following problem occurs. Specifically the exhaust heat amount in the condenser changes depending on the flow rate and the temperature of a heat exchange medium introduced in the condenser. Meanwhile, in a case of a semiconductor device manufacturing plant as a typical example of installing an apparatus to which the aforementioned prior art is applied, water supplied by the plant is commonly used as the heat exchange medium.

In such a semiconductor device manufacturing plant, the water temperature varies depending on the place, the surrounding environment or the user, and thus the temperature control performance of the aforementioned apparatus is different from a desired performance that the designer of the apparatus is expected to achieve, thus causing a problem of impaired performance. For example, even if the expansion valve opening degree is set constant, a reduction in the exhaust heat amount in the condenser causes a rise in refrigerant enthalpy and a rise in refrigerant evaporation temperature, resulting in a change in variable temperature range by the expansion valve.

Under such conditions, the aforementioned prior art does not consider the problem of the apparatus designed to satisfy the originally required specifications being unable to achieve the temperature range required to satisfy the specifications at the installed position.

Note that the technique for controlling the heat exchange amount in the condenser as disclosed in JP-A-H3-31640 can be used to extend the temperature setting range using the pressure control by the expansion valve and the heat exchange amount control by the condenser. However, the heat exchange amount control by the condenser takes time to control the flow rate and the temperature of the heat exchange medium and the heat capacity of the condenser itself also is an obstacle, making a rapid control difficult.

In short, there is a problem of unable to achieve a high temperature response if the sample stage temperature is controlled by both the expansion valve opening degree and the condenser heat exchange amount. Further, the two objects to be controlled: the expansion valve opening degree and the condenser heat exchange amount, for one control variable of the sample stage temperature may interfere with each other, resulting in an unstable temperature of the target sample stage.

It is an object of the present invention to provide a plasma processing apparatus or a plasma processing method that can provide a high temperature response and a wide temperature setting range.

The above object is achieved by a plasma processing method for mounting each one of a plurality of samples to be processed in a processing chamber and processing each one of the plurality of samples in the processing chamber, the method including mounting one sample of the plurality of samples to be processed on an upper surface of a sample stage disposed in a processing chamber inside a vacuum container, supplying a process gas into the processing chamber, generating a plasma using the process gas, and processing the one mounted sample using the plasma, wherein, in which a refrigerating cycle comprises a refrigerant passage, a compressor, and a condenser, all of which are coupled in this order, and through which a refrigerant flows in this order, the refrigerant passage being disposed inside the sample stage, through inside of which the refrigerant flows to serve as an evaporator, the refrigerating cycle further includes first and second expansion valves which are interposed between the condenser and the refrigerant passage and between the refrigerant passage and the compressor respectively; a vaporizer that is interposed between the second expansion valve and the compressor in the refrigerating cycle and which heats and vaporizes the refrigerant; and first and second rate flow valves each of which control flow rate, speed, or temperature of refrigerant flowing in respective first and second pipe channels each of which are different from said refrigerant passage. The plasma processing method further comprises controlling a temperature of the sample stage to a desired value, the step of controlling the temperature of the sample stage to a desired value further including: regulating refrigerant heat exchange amounts in both of the condenser and the vaporizer based on a refrigerant temperature between the condenser and the second expansion valve in a period occurring after an end of the processing of the one mounted sample using the plasma and before a start of the processing of another one of the plurality of samples using the plasma, by increasing an amount of a heat exchange medium supplied to one of the condenser and the vaporizer, and decreasing the amount of the heat exchange medium supplied to the other of the condenser and the vaporizer, in parallel, so as to change the temperature of the sample stage to another value suitable for starting the processing of said another one of the plurality of samples in the another temperature condition, while the first and second expansion valves are maintained at a specific valve opening; starting processing of the another one of the plurality of samples; and regulating the opening and closing of the first and second expansion valves by increasing an opening degree of one of the first and second expansion valves and decreasing an opening degree of the other of the first and second expansion valves in parallel while regulating the refrigerant heat exchange amounts in both of the condenser and the vaporizer to a desired value in a predetermined range.

DETAILED DESCRIPTION OF THE EMBODIMENT

Hereinafter, an embodiment of the present invention will be described with reference to the accompanying drawings.

Figure 1:
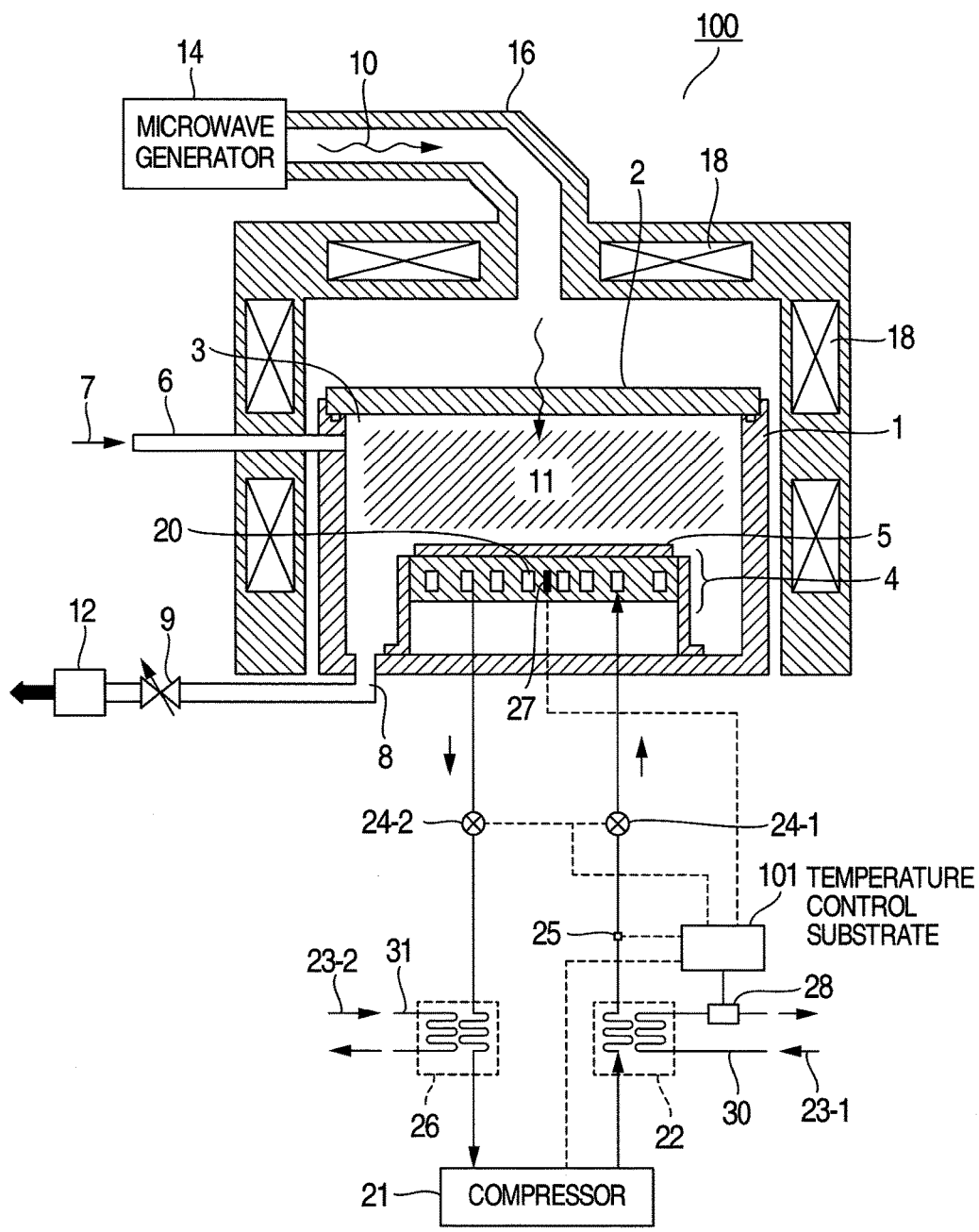
FIG. 1 is a longitudinal sectional view schematically illustrating a configuration of a plasma processing apparatus according to an embodiment of the present invention.

Hereinafter, a first embodiment of the present invention will be described with reference to FIGS. 1 to 3. FIG. 1 is a longitudinal sectional view schematically illustrating a configuration of a plasma processing apparatus according to the embodiment of the present invention. In particular, the present embodiment shows an ECR plasma etching apparatus in which a microwave electric field and a magnetic field of a predetermined intensity are supplied into a processing chamber disposed inside a vacuum container and a process gas introduced into the processing chamber is excited to generate a plasma, and which performs etching on a film to be processed on an upper surface of a substrate-like sample such as a semiconductor wafer that is mounted and maintained on an upper surface of a sample stage placed under a region in which the plasma is generated in the processing chamber.

In this figure, a plasma processing apparatus 100 includes a vacuum container section including a vacuum container having a processing chamber 3 thereinside and a sample stage disposed inside the vacuum container; a plasma generating section that is disposed above and around the vacuum container section and which supplies the electric field or the magnetic field into the processing chamber 3; and a vacuum exhaust section that is disposed under the vacuum container and which communicates inside the processing chamber 3 through an opening and exhausts the inside thereof and reduce the pressure thereinside. In addition, an outside wall of the vacuum container is attachably and detachably coupled to a transport vessel which is an unillustrated vacuum container and the pressure inside which is reduced to a pressure equal to or slightly higher than that of the processing chamber 3 and in which a sample is transported by means of a robot arm or the like; and the inside of the processing chamber 3 is configured to be in communication with the transport chamber inside the transport vessel through a gate which is opened and disposed on a side wall of the vacuum container.

The vacuum container is a vessel having a cylindrical section constituting a processing chamber 3 having a cylindrical circular cross section and a processing chamber wall 1 having a cylindrical inside wall surface is configured such that a processing chamber lid 2 that is a circular plate made of quartz and constitutes the vacuum container is placed above the upper end thereof. The processing chamber lid 2 is pressed against an upper end having a ring-shaped cross section of the processing chamber wall 1 with an unillustrated seal member interposed therebetween to hermetically seal between inside the processing chamber 3 and the air atmosphere outside thereof, thereby enabling the pressure inside the processing chamber 3 to be reduced to a predetermined pressure.

A sample stage 4 is disposed under a space in which a plasma is generated inside the processing chamber 3 and a substrate-like sample 5 (a semiconductor wafer in the present embodiment) is transported to be mounted on an upper surface thereof by means of a transport device such as the robot arm. A gas introduction pipe 6 is coupled to an upper portion of the vacuum container and the inside thereof is communicated to a plasma generating space which is an upper portion of the processing chamber 3. A process gas 7 for etching a plasma flowing inside a gas introduction pipe 6 coupled to an unillustrated gas source is introduced into the processing chamber 3 through the gas introduction hole facing the plasma generating space which is an upper portion of the processing chamber 3.

An exhaust port 8, which is an opening for exhausting gases or particles inside the processing chamber 3, is disposed in a lower portion of the processing chamber 3 under the sample stage 4. In the figure, the exhaust port 8 is disposed in a bottom portion of the vacuum container surrounding the processing chamber 3, but the exhaust port 8 may be disposed immediately under the sample stage 4, which is held in a center portion in the vertical direction inside the processing chamber 3, at a position where the central axis in the vertical direction of the cylindrical vacuum container or each of the processing chamber 3, the cylindrical sample stage 4, and the circular exhaust port 8 is matched or close enough to be considered a match.

The exhaust port 8 is coupled to a pressure control valve 9 disposed outside under the vacuum container and a turbo molecular pump 12 which is a kind of vacuum pump. By the operation of these, a process gas 7 introduced into the processing chamber 3 and byproducts produced by etching are discharged outside the processing chamber 3 through the exhaust port 8. The pressure control valve 9 of the present embodiment has a function of increasing or decreasing the passage sectional area of an exhaust path serving as a duct coupling from the exhaust port 8 to the turbo molecular pump 12. The opening degree of the pressure control valve 9 is regulated to maintain a balance between the flow rate of the exhaust gas from the exhaust port 8 and the flow rate of the process gas 7 introduced from the gas introduction pipe 6 into the processing chamber 3 so that the pressure inside the processing chamber 3 is regulated to a pressure (a value in a range of 0.1 to 10 Pa in the present embodiment) appropriate to process or transport the wafer 5.

A plasma generating section includes a means of generating and propagating an electric field and a magnetic field disposed outside the vacuum container, above the processing chamber lid 2, and on a side of the vacuum container wall 1. In the present embodiment, the electric field is generated by a microwave generator 14, and the generated microwave 10 is propagated through a waveguide 16, passing through the processing chamber lid 2 made of quartz, and then is supplied into the processing chamber 3.

The waveguide 16 includes a cylindrical section vertically extending above the processing chamber lid 2 having a circular cross section; and a rectangular tubular section that is formed by coupling an upper end portion of the cylindrical section to one end portion thereof so as to extend horizontally and to have a rectangular in cross section. The microwave generator 14 such as a magnetron is disposed at the other end portion of the rectangular tubular section.

A solenoid coil 18 serving as a direct current magnetic field generating means is installed above the processing chamber lid 2 and around the outside of the processing chamber wall 1, and the magnetic field generated thereby is supplied into the processing chamber 3. A magnetic field of a predetermined intensity that can resonate with the microwave 10 of a predetermined frequency (2.54 GHz in the present embodiment) generated by the microwave generator 14 is supplied into the processing chamber 3. The interaction of these excites the particles of the process gas 7 to generate a plasma 11 inside the processing chamber 3, and the plasma 11 is used to perform etching on an upper surface of the sample 5.

In the present embodiment, in order to maintain and regulate the temperature of the sample 5 to an appropriate temperature during processing, R410a (hydrofluorocarbon) is supplied as a refrigerant and circulated in a refrigerant passage 20 disposed inside the sample stage 4. The refrigerant passage 20 is disposed in a plurality of multiplexed circular or ring shapes or in a spiral shape around a disc-shaped metal base material having a circular cross section and forming the cylindrical sample stage 4, and has a rectangular tubular section.

In the present embodiment, an outlet of the refrigerant passage 20, a second expansion valve 24-2, a refrigerant vaporizer 26, a compressor 21, a condenser 22, a first expansion valve 24-1, and an inlet of the refrigerant passage 20 are coupled to each other in this order by a refrigerant pipe into which the refrigerant flows and which constitutes a cooling cycle for circulating the refrigerant. The base material of the refrigerant passage 20 and the sample stage 4 enclosing the refrigerant passage 20 serves as an evaporator in the refrigerating cycle.

In the refrigerating cycle, the condenser 22 serves as a heat exchanger in which the refrigerant undergoes heat exchange inside the passage and releases latent heat to be liquefied. The condenser 22 is thermally connected to a pipe channel 30 in which a heat exchange medium 23-1 serving as a secondary medium subjected to heat exchange with the refrigerant flows, which provides a configuration in which the refrigerant exchanges heat with the heat exchange medium 23-1. Specifically, the condenser 22 is configured such that the pipe channel 30 of the heat exchange medium 23-1 having a combination of a plurality of curved portions and parallel linear portions in the same manner as the refrigerant pipe contacts or passes through a plurality of metal fins having a plurality of curved portions and linear portions in which the plurality of linear portions are disposed in parallel and through which the refrigerant pipe passes.

A condenser flow rate valve 28 serving as a means of regulating the flow rate or the temperature of the heat exchange medium 23-1 to a predetermined value is disposed in a pipe channel coupled to a supply port (inlet) or a discharge port (outlet) of the pipe channel 30 of the heat exchange medium 23-1 in the condenser 22. The present embodiment uses water as the heat exchange medium 23-1 and operates the condenser flow rate valve 28 to control the flow rate. A refrigerant such as Fluorinert may be used as the heat exchange medium 23-1 or a temperature-regulated boilable or unboilable refrigerant may be supplied into the pipe channel 30 of the condenser 22 to regulate the heat exchange amount in the condenser 22.

The present embodiment also includes a refrigerant vaporizer 26 that is disposed in the refrigerant pipe between the outlet of the refrigerant passage 20 and the inlet of the compressor 21, and which vaporizes a refrigerant by heating the refrigerant in a liquid state to be completely or substantially completely evaporated. The refrigerant vaporizer 26 also is a heat exchanger like the condenser 22 in which a plurality of fins through which linear portions of a plurality of parallel-arranged refrigerant pipes pass are thermally connected to the meander-arranged pipe channel 31 through which the heat exchange medium 23-2 serving as a secondary refrigerant flows, and in which the refrigerant exchanges heat with the heat exchange medium 23-2.

Further, there is provided a load side thermometer 27 serving as a temperature sensor that is interposed between the sample stage 4 or the first expansion valve 24-1 and the second expansion valve 24-2 and which detects the refrigerant temperature or evaporator temperature; there is also provided a refrigerant thermometer 25 that is interposed between the condenser 22 and the first expansion valve 24-1 and which detects the refrigerant temperature at the condenser outlet. In the present embodiment, the load side thermometer 27 includes a resistance member that is disposed inside a base material of the sample stage 4.

There follows a description of the operation of the refrigerating cycle according to the present embodiment for regulating the temperature of the sample stage 4 (evaporator). The sample 5 is assumed to be processed in a state that the sample 5 is mounted on a mounting surface of the sample stage 4 and a plasma is generated in the processing chamber 3. In this state, the refrigerating cycle operates in response to a command signal from a temperature control substrate 101 serving as a control apparatus described later to regulate the temperature of the sample stage 4 or the base material and therefore the sample 5 to a range appropriate for an etching process to be carried out or being in progress.

The refrigerant in the refrigerating cycle is fed by rotation of the compressor 21 to be introduced into the condenser 22 through the pipe channel. In the condenser 22, water whose flow rate, speed, or temperature is regulated to a predetermined range by the condenser flow rate valve 28 is supplied into the pipe channel 30. Then, the refrigerant introduced into the refrigerant pipe inside the condenser 22 exchanges heat with the water in the pipe channel 30 to thereby release latent heat inside the refrigerant, so that the latent heat is transmitted to the water and the refrigerant is condensed.

The condensed and liquefied refrigerant passes through the first expansion valve 24-1 whose opening degree is regulated to a predetermined range, and then is introduced into the sample stage 4 from an inlet of the refrigerant passage 20. The refrigerant inside the refrigerant passage 20 exchanges heat with a base material whose temperature is increased by the amount of heat supplied from the plasma to the sample 5 and the sample stage 4 through the sample 5. Then, the refrigerant flows through the refrigerant passage 20 while being evaporated, causing the base material temperature near the refrigerant passage 20 to be close to a value of the refrigerant evaporation temperature.

The refrigerant in a state (gas-liquid mixture) in which gases and liquids are mixed inside the refrigerant passage 20 flows out of the outlet of the refrigerant passage 20, passing through the refrigerant pipe and then through the second expansion valve 24-2 whose opening degree is regulated, and is introduced into the refrigerant vaporizer 26. Water is introduced as the heat exchange medium 23-2 into the pipe channel 31 of the refrigerant vaporizer 26 in the same manner as into the pipe channel 30 of the condenser 22. The refrigerant whose temperature is reduced while passing through the second expansion valve 24-2 exchanges heat with the water of the heat exchange medium 23-2, resulting in that all or substantially all of the refrigerant in a liquid state vaporize.

The present embodiment regulates the opening degree of the first expansion valve 24-1 and the second expansion valve 24-2 for increasing and decreasing the sectional area of the refrigerant passage by opening and closing thereof, so that the temperature or the pressure of the refrigerant introduced in the refrigerant passage 20 is regulated to a desired value in a range appropriate for etching. For example, if the opening degree of the first expansion valve 24-1 is set small or the opening degree of the second expansion valve 24-2 is set large in the refrigerating cycle, the pressure of the refrigerant in a portion therebetween is reduced, resulting in a reduction in the temperature of the refrigerant circulating in the refrigerant passage 20 and a reduction in the refrigerant evaporation temperature.

On the contrary, if the opening degree of the first expansion valve 24-1 is set large or the opening degree of the second expansion valve 24-2 is set small, the pressure of the refrigerant circulating in the refrigerant passage 20 is increased, resulting in an increase in the refrigerant temperature and an increase in the refrigerant evaporation temperature. As described above, the first expansion valve 24-1 and the second expansion valve 24-2 can regulate the temperature of the refrigerant passage 20 and therefore the sample stage 4 (upper surface thereof) and the sample 5 by increasing or decreasing the respective opening degree thereof. In particular, the present embodiment uses both the first expansion valve 24-1 and the second expansion valve 24-2 to perform the operation of increasing or decreasing the respective opening degree thereof in parallel in the opposite direction, which can achieve a wider range of temperature, can further improve response to change in temperature, and can achieve a desired temperature with a higher precision than when either one of the first expansion valve 24-1 and the second expansion valve 24-2 is used separately.

The present embodiment regulates the opening degrees of the first expansion valve 24-1 and the second expansion valve 24-2 in response to a command signal from the temperature control substrate 101 so that one of the opening degrees is increased while the other of the opening degrees is reduced. Specifically, the temperature control substrate 101 commands each valve to perform the operation of increasing one of the opening degrees and perform the operation of decreasing the other one of the opening degrees in parallel for regulation. The detailed values of the opening degrees are such that a calculation unit in the temperature control substrate 101 uses a predetermined algorithm to calculate each opening degree so that the sum of the inverse of one of the opening degrees and the inverse of the other one of the opening degrees is constant. The operation of the first expansion valve 24-1 and the second expansion valve 24-2 is regulated to be the respective opening degree values.

Note that the refrigerant temperature in the refrigerant passage 20 may be regulated by regulating the heat exchange amount in the condenser 22. For example, even if the opening degree of the first expansion valve 24-1 is set constant, a reduction in refrigerant exhaust heat amount in the condenser 22 increases the refrigerant temperature in the refrigerant passage 20. On the contrary, an increase in the exhaust heat amount in the condenser 22 can reduce the refrigerant temperature in the refrigerant passage 20.

The opening degrees of the first expansion valve 24-1 and the second expansion valve 24-2 are regulated in response to a command signal from the temperature control substrate 101 based on information detected using an output from the load side thermometer 27 disposed inside the base material of the sample stage 4. On the basis of a value detected from an output of the refrigerant thermometer 25 that is disposed in the refrigerant pipe between the condenser 22 and the first expansion valve 24-1 and which detects the refrigerant temperature at a condenser outlet, the settings of the opening degrees or the temperature of the condenser flow rate valve 28 are regulated to regulate the heat exchange amount in the condenser 22.

Note that in the present embodiment, the target temperature value of the sample 5 during etching is programed by software such as a program previously stored in a storage means inside the temperature control substrate 101. The signal outputted from each of the above thermometers is transmitted via a wired or wireless communication, and the temperature control substrate 101 that receives the signal through a communication interface detects the target temperature. According to the value, a calculation means disposed inside the temperature control substrate 101 calculates the opening degree of each valve to be controlled based on the algorism such as software stored in the storage means previously disposed thereinside as well. A command signal based on this is transmitted to the first expansion valve 24-1 and the second expansion valve 24-2 or the condenser flow rate valve 28 and thereby the temperature of the sample 5 or the sample stage 4 is feedback-controlled.

Figure 2:
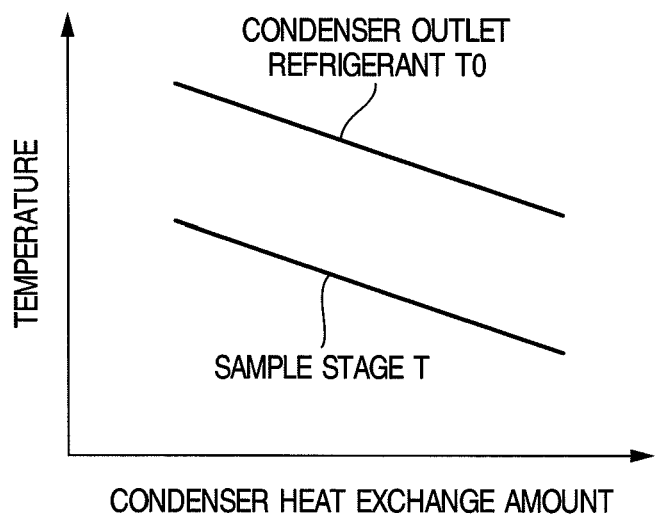
FIG. 2 is a graph illustrating a change in sample stage temperature with respect to a change in condenser heat exchange amount according to the embodiment illustrated in FIG. 1.

FIG. 2 is a graph illustrating a change in sample stage temperature with respect to a change in condenser heat exchange amount according to the embodiment illustrated in FIG. 1. As illustrated in this figure, when the flow rate of the water introduced into the condenser 22 is increased to increase the refrigerant exhaust heat amount (amount of latent heat of the refrigerant transmitted to the water) in the condenser 22, the heat exchange amount in the condenser 22 is increased. Thereby, even if the opening degree of the first expansion valve 24-1 is not increased or decreased, the temperature, the pressure, or the evaporation temperature of the refrigerant inside the refrigerant passage 20 is reduced and a temperature T of the sample stage 4 is reduced. In short, the temperature T of the sample stage 4 can be regulated by increasing or decreasing the heat exchange amount in the condenser 22.

As illustrated in this figure, both the change in refrigerant temperature T0 at an outlet of the condenser 22 and the change in temperature T of the sample stage 4 show equally uniform phenomenon characteristics. Note that this figure illustrates an example of a state in which the opening degree of the first expansion valve 24-1 is set to a predetermined value and a passage resistance occurs (the first expansion valve 24-1 is in a fully opened state, namely, an unobstructed state without blocking the passage inside the refrigerant pipe). Thus, the refrigerant temperature T0 at an outlet of the condenser 22 on an upstream side is higher than the temperature T of the sample stage 4 on an downstream side with respect to the first expansion valve 24-1.

Figure 3:
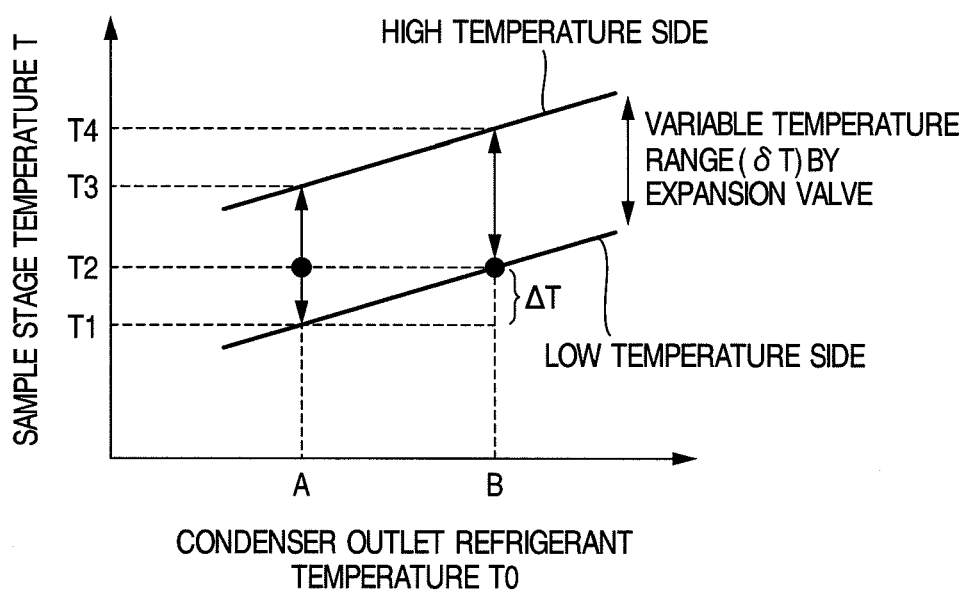
FIG. 3 is a graph illustrating a change in sample stage temperature with respect to a change in temperature on a condenser outlet side according to the embodiment illustrated in FIG. 1.

FIG. 3 is a graph illustrating a change in sample stage temperature with respect to a change in temperature on the condenser outlet side according to the embodiment illustrated in FIG. 1. In this figure, with the increase in the refrigerant temperature T0 at an outlet of the condenser 22 on the horizontal axis, the temperature T of the sample stage 4 also increases. As described in FIG. 2, this means the more the heat exchange amount of the condenser 22 is reduced, the more the outlet refrigerant temperature T0 of the condenser 22 increases, and therefore the more the temperature T of the sample stage 4 increases.

This figure also illustrates a variable temperature range by the expansion valve in the refrigerating cycle. The sample stage temperature T can be controlled to a low temperature by reducing the opening degree of the first expansion valve 24-1; while the sample stage temperature T can be controlled to a high temperature by increasing the opening degree of the first expansion valve 24-1. At this time, the second expansion valve 24-2 is disposed to be operated in a direction of increasing or decreasing the opening degree thereof in the reverse direction to that of the first expansion valve 24-1, thereby increasing the variable temperature range ST by both the expansion valves 24-1 and 24-2. It is understood from the above description that when the heat exchange amount in the condenser 22 is controlled so that the condenser outlet refrigerant temperature T0 is controlled to A, the sample stage temperature T can be controlled in the range from T1 to T3 by controlling the opening degrees of the first expansion valve 24-1 and the second expansion valve 24-2 in pairs.

Here, it is described that the system configuration and the control method in FIGS. 1 to 3 are effective in achieving a high temperature response and a wide temperature control range using a direct expansion sample stage cooling system.

For the object temperature control using the refrigerating cycle, it is effective to regulate the refrigerant temperature (or pressure, evaporation temperature) by the expansion valve 24-1 or 24-2 from the point of view of the temperature response of the sample stage 4 (heat exchanger). Meanwhile, in the present embodiment, in order to regulate the heat exchange amount in the condenser 22, it is necessary to regulate the opening degree of the condenser flow rate valve 28 and to increase or decrease the flow rate of the heat exchange medium 23-1 flowing into the condenser 22, resulting in change in heat exchange amount. Thus, it takes time from the start of the operation of the condenser flow rate valve 28 to a change to a desired refrigerant temperature.

In addition, two media of the refrigerant and the heat exchange medium 23-1 flow into the condenser 22. The relatively large heat capacity also is a factor that it takes time to cause the heat exchange amount to be changed to a desired value. Meanwhile, the increase or decrease in the opening degree of the expansion valve 24-1 or 24-2 means a direct regulation in resistance of the refrigerant pipe flow in the refrigerating cycle, and thus the refrigerant pressure, namely, the refrigerant temperature can be regulated with good response. In light of this, in the present embodiment, before an etching process on a film to be processed of the sample 5 starts, in response to the command signal from the temperature control substrate 101, the opening degree of the condenser flow rate valve 28 is regulated so that the variable temperature range ST by the expansion valve 24-1 or 24-2 can cover the temperature range required at the etching process. Specifically, the refrigerant temperature T0 at an outlet of the condenser 22 is regulated to a value within the set range calculated based on data stored in a database previously stored in the storage means, which completes the regulation. During the subsequently started etching process, the temperature of the sample 5 appropriate for a predetermined recipe for each process step is achieved by increasing or decreasing the opening degree of the expansion valve 24-1 or 24-2 in response to the command signal from the temperature control substrate 101.

If the sample stage temperature T is controlled only by the expansion valve opening degree assuming that the heat exchange amount of the condenser 22 is constant as disclosed in JP-A-2009-272535, the temperature control range for the sample stage temperature T may not be sufficiently secured. For example, in FIG. 3, if there is an etching process requiring the sample stage temperature T in the temperature range from T1 to T3, the heat exchange amount may be initially set so that the condenser outlet refrigerant temperature T0 is set to A. However, if there is another etching process requiring control in the temperature range from T2 to T4, the prior art that cannot perform the heat exchange amount control of the condenser 22 like the present embodiment can handle only the temperature range from T2 to T3, and hence cannot achieve the temperature range from T3 to T4, which cannot obtain a desired result.

Note that assuming that the exhaust heat amount in the condenser 22 changes depending on the flow rate and the temperature of the heat exchange medium flowing in the condenser 22, the variable temperature range may change by receiving the influence of a change in the amount or the temperature of the cooling water in the semiconductor device manufacturing plant. In practice, the temperature of the cooling water to be used is commonly different depending on the semiconductor device manufacturing plant. Thus, if the heat exchange amount in the condenser 22 cannot be appropriately regulated, it is consequently difficult to achieve a desired temperature T of the sample stage 4.

Here, with reference to FIG. 3, a description is given to an actual operation example in which the sample stage temperature T is detected to control the expansion valve opening degree and the heat exchange amount of the condenser 22. For example, assume that it is necessary to control the sample stage temperature T in the range from T1 to T3 during an etching process and the temperature setting value (target value) in the first step is T2. In this case, assume that the expansion valve opening degree and the heat exchange amount of the condenser 22 are controlled based on a value detected from the sample stage thermometer 27; the condenser outlet temperature T0 is B; and the sample stage temperature T reaches T2. Then, when the setting value (target value) of the sample stage temperature T changes to T1 during the etching process, the expansion valve has already been in a state of being controlled to a boundary on a low temperature side, and hence it is necessary to increase the heat exchange amount of the condenser 22 to change the outlet refrigerant temperature T0 from B to A. In this case, the temperature control is performed on the sample stage temperature T by ΔT using the heat exchange amount of the condenser 22, which cannot obtain a high response.

In light of this, the present invention provides a thermometer 25 that is interposed between an outlet of the condenser 22 and the first expansion valve 24-1 and which measures the condenser outlet refrigerant temperature T0; and based on the detection value, the opening degree of the condenser flow rate valve 28 is controlled to regulate the heat exchange amount of the condenser 22, which can secure the temperature control range of the expansion valve. This configuration can provide a rapid temperature control in a desired temperature range using the expansion valve.

Assume a case where a plurality of process steps are used to perform an etching process on at least one layer of film structure to be processed, which is previously formed and placed on the sample 5 which is a wafer to be processed; a case where it is found before processing that the value of the temperature of an upper surface of the sample 5 or the sample stage 4 suitable for these process steps or the magnitude of the difference thereof exceeds ST; and a case where in a building such as a clean room in which the plasma processing apparatus 100 is installed, commands are issued regarding the transport timing of the cassette containing the sample therein and the amount thereof or the process conditions for each cassette, and the recipe is received from a host computer controlling these operations to make a determination on the above, and the results are found. In the above cases, the opening degree or the temperature set by the condenser flow rate valve 28 is increased or decreased based on the command signal from the temperature control substrate 101 so that the value of the temperature suitable for these process conditions become the outlet refrigerant temperature T0 of the condenser 22 that can be achieved in the range of δT. Specifically, in FIG. 3, when the temperature of the sample 5 suitable for the target film etching process step is found to be within the range from T3 to T4, the outlet temperature T0 of the condenser 22 is increased in a direction from A to B in a process step before the process starts; the value of the outlet refrigerant temperature T0 of the condenser 22 which can be achieved in the temperature range ST and which can be changed by the operation of the opening and closing of the pair of the first and second expansion valves 24-1 and 24-2 is calculated by the calculation unit according to a predetermined algorism and a temperature of A or higher is selected; and hence the appropriate temperatures in these process steps can be achieved by increasing or decreasing the heat exchange amount according to the operation of the condenser flow rate valve 28 by a feedback control using an output of the refrigerant thermometer 25 to be carried out according to the command signal.

In the above embodiment, the operation of regulating the temperature of the sample stage 4 (and the upper surface thereof and the sample 5) to a range suitable for the process by regulating the refrigerant temperature, the pressure, and the evaporation temperature in the refrigerant passage 20 is performed by linking the operation of the first expansion valve 24-1, the second expansion valve 24-2, and the condenser flow rate valve 28. Meanwhile, generally, the process conditions including an appropriate temperature in the above process steps are set for each group (lot) of the samples 5 such as a plurality of semiconductor wafers having a film structure equal or close enough to be considered equal on an upper surface thereof. From the above, the regulation of selecting the outlet refrigerant temperature T0 of the condenser 22 for increasing or decreasing may be performed for each lot in available processing time such as before the above process condition is changed, after the previous lot process ends, or during the time from when the process of the last sample 5 to be processed ends until the process of a next lot or a next sample 5 from a next cassette in the same lot starts; and the change in temperature of the sample 5 or the sample stage 4 between the process steps may be performed by the operation of opening and closing the pair of the first and second expansion valves 24-1 and 24-2.

Figure 4:
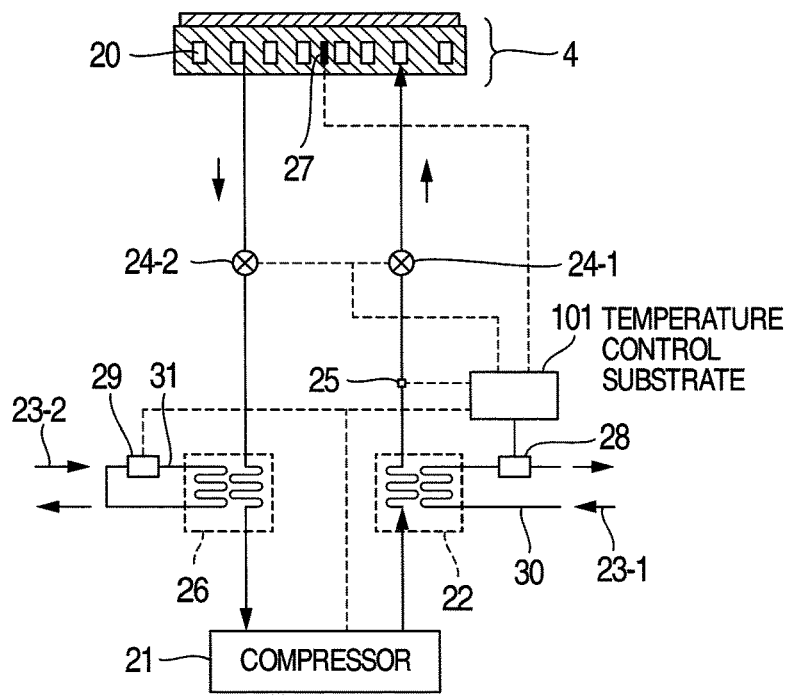
FIG. 4 is a longitudinal sectional view schematically enlarging the configuration of a sample stage and a refrigerating cycle of the plasma processing apparatus according to a modification of the embodiment illustrated in FIG. 1.

FIG. 4 is a longitudinal sectional view schematically enlarging the configuration of the sample stage and the refrigerating cycle of the plasma processing apparatus according to a modification of the embodiment illustrated in FIG. 1.

In order to reduce in-plane non-uniformity of the temperature of the upper surface of the sample stage 4 or the sample 5 mounted thereon, it is desirable to maintain a gas-liquid two-phase state by suppressing a so-called dryout, which means a state in which the refrigerant is completely vaporized and the refrigerant in a liquid state disappears, from occurring in the refrigerant passage 20 inside the sample stage 4. Meanwhile, it is necessary to suppress the refrigerant in a liquid state, which maintains the gas-liquid two-phase state until the outlet of the sample stage refrigerant passage 20, from flowing into the compressor 21.

In the present embodiment, in order to evaporate the refrigerant in a liquid state between the outlet of the refrigerant passage 20 and the inlet of the compressor 21, the refrigerant vaporizer 26 is disposed in the refrigerant pipe between the sample stage 4 and the compressor 21, particularly between the second expansion valve 24-2 and the compressor 21. The refrigerant vaporizer 26 includes a pipe channel 31 that is thermally connected to the refrigerant pipe in the same manner as the condenser 22 and in which the heat exchange medium 23-2 for exchanging heat with the refrigerant flows. The second expansion valve 24-2 is interposed between the refrigerant vaporizer 26 and the outlet of the refrigerant passage 20 in the sample stage 4. The refrigerant in a liquid state contained in the refrigerant whose pressure is reduced by the second expansion valve 24-2 and whose evaporation temperature is reduced receives heat from water flowing through the pipe channel 31 and evaporates while flowing through the refrigerant pipe of the refrigerant vaporizer 26, and then returns to the compressor 21 in a gaseous state without containing the refrigerant in a liquid state.

At this time, the dryness degree of the refrigerant changes depending on the magnitude of the latent heat amount (heat absorption amount) absorbed when the refrigerant evaporates in the refrigerant vaporizer 26. Therefore, even if the opening degree of the first expansion valve 24-1 is maintained constant, an increase in heat absorption amount in the refrigerant vaporizer 26 increases the refrigerant enthalpy and refrigerant evaporation temperature in the refrigerant passage 20 inside the sample stage 4.

In order to maintain the value of the temperature in the refrigerant passage 20, and therefore the sample stage 4, and the sample 5 mounted thereon to be in a range suitable for the process, it is necessary to regulate the heat absorption amount of the refrigerant in the refrigerant vaporizer 26. In the present embodiment, the pipe channel 31 coupled to the inlet or the outlet of the refrigerant vaporizer 26 includes a vaporizer flow rate valve 29 having a configuration equivalent to the condenser flow rate valve 28 which can variably regulate the flow rate, the speed, or the temperature of the heat exchange medium 23-2.

Figure 5:
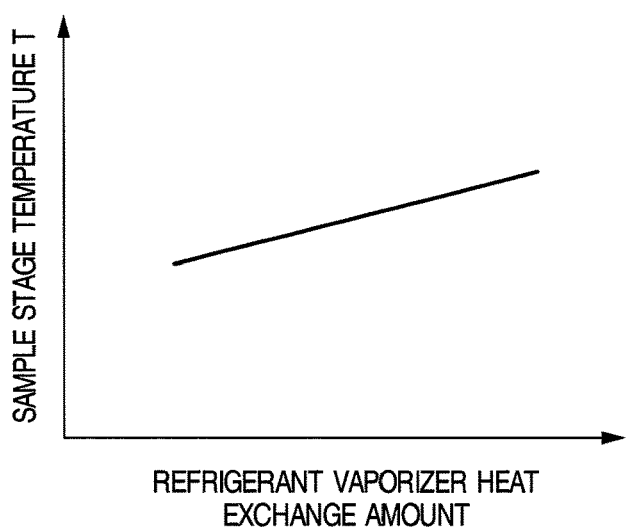
FIG. 5 is a graph illustrating a change in sample stage temperature with respect to a change in vaporizer heat exchange amount according to the embodiment illustrated in FIG. 1.

FIG. 5 is a graph illustrating a change in the sample stage temperature with respect to a change in the vaporizer heat exchange amount according to the embodiment illustrated in FIG. 1. As described above, an increase in the heat exchange amount in the refrigerant vaporizer 26 increases the temperature, the pressure, or the evaporation temperature of the refrigerant in the refrigerant passage 20 inside the sample stage 4.

It is understood from the above that in order to achieve a wider range of temperature of the refrigerant to be supplied to the sample stage 4, it is effective to regulate not only the temperature, the pressure, or the evaporation temperature of the refrigerant by the first expansion valve 24-1 and the second expansion valve 24-2 but also the heat exchange amount of the condenser 22 or the refrigerant vaporizer 26. In light of this, the present embodiment controls the opening degrees of the condenser flow rate valve 28 and the vaporizer flow rate valve 29 in a reverse direction to each other, that is, controls the heat exchange amount of the condenser 22 and the refrigerant vaporizer 26 in pairs.

In other words, the operation of reducing the flow rate or the speed of one of the pairs is performed in parallel to the operation of increasing the flow rate or the speed of the other one of the pairs. For example, the temperature control substrate 101 issues a command signal to the condenser flow rate valve 28 and the vaporizer flow rate valve 29, the command signal indicating the operation of increasing the valve opening degree of the condenser flow rate valve 28 or decreasing the temperature of the heat exchange medium 23-1; and the operation of decreasing the valve opening degree of the vaporizer flow rate valve 29 or increasing the temperature of the heat exchange medium 23-2. The response to the increase or decrease in the heat exchange amount by the operation of the condenser flow rate valve 28 and the vaporizer flow rate valve 29 is relatively small, and hence it is not essential to perform these operations at the same time. These operations may be performed to an extent that the temperature (pressure) of the refrigerant in the refrigerant passage 20 of the sample stage 4 in the refrigerating cycle may not increase or decrease beyond the tolerance with a time difference to an extent that can be considered substantially in parallel.

The configuration actively regulates the heat exchange amount of the heat exchangers other than the sample stage 4 subjected to temperature control in the refrigerating cycle, particularly so as to cause the condenser flow rate valve 28 and the vaporizer flow rate valve 29 to be operated substantially in parallel, which can extend the feasible temperature range of the refrigerant temperature in the refrigerant passage 20 inside the sample stage 4, and therefore the temperature of the sample stage 4 and the sample 5. These temperature regulations may be performed by linking the operations of the first expansion valve 24-1, the second expansion valve 24-2, the condenser flow rate valve 28, and the vaporizer flow rate valve 29. In addition, the feedback control for the outlet refrigerant temperature T0 of the condenser 22, which is performed by increasing or decreasing the heat exchange amount of each of the condenser 22 and the vaporizer 26 by opening and closing the condenser flow rate valve 22 and the vaporizer flow rate valve 29 in pairs, may be performed before the process starts or in available processing time from when the process ends until a next process starts in the same manner as in the aforementioned embodiment.

As described above, the aforementioned embodiment can be applied to regulate the temperature of the sample 5 to a value suitable for processing in a wide temperature range at the etching process step with a high precision. It was found from an experiment using the configuration illustrated in FIG. 4 that the outlet refrigerant temperature T0 of the condenser 22 was controlled to 47° C. and the temperature T of the sample stage 4 was controlled in a range from 15 to 45° C. by a regulation of increasing or decreasing the opening degrees of the expansion valves 24-1 and 24-2 with excellent temperature response. Note that the above embodiment has described an example having a configuration in which one direct expansion refrigerating cycle is provided for one passage inside the sample stage 4 to regulate the temperature, but another configuration may be used in which a plurality of refrigerant passages 20 are installed in the sample stage 4 so as to provide a temperature difference in a radial direction or a circumferential direction of the circular cross section thereof, and a refrigerating cycle including the condenser 22 or the refrigerant vaporizer 26 which can regulate the heat exchange amount is provided for each refrigerant passage 20, which can regulate the circular in-plane temperature distribution of the sample stage 4 and therefore the sample 5 to a desired one with high precision and excellent response.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for mounting each one of a plurality of samples to be processed in a processing chamber and processing said each one of the plurality of samples in the processing chamber, the method comprising:
    mounting one sample of said plurality of samples to be processed on an upper surface of a sample stage disposed in a processing chamber inside a vacuum container;
    supplying a process gas into the processing chamber at a first temperature condition;
    generating a plasma using the process gas; and
    processing said one mounted sample using the plasma, wherein
    a refrigerating cycle comprises a refrigerant passage, a compressor, and a condenser, all of which are coupled in this order, and through which a refrigerant flows in this order, the refrigerant passage being disposed inside the sample stage, through inside of which the refrigerant flows to serve as an evaporator,
    the refrigerating cycle further comprises:
    first and second expansion valves which are interposed between the condenser and the refrigerant passage and between the refrigerant passage and the compressor respectively; and
    a vaporizer that is interposed between the second expansion valve and the compressor in the refrigerating cycle and which heats and vaporizes the refrigerant, and the plasma processing method further comprises:
    controlling a temperature of the sample stage to a desired value,
    wherein said step of controlling the temperature of the sample stage to a desired value further comprises:
    regulating refrigerant heat exchange amounts in both of the condenser and the vaporizer based on a refrigerant temperature between the condenser and the second expansion valve in a period occurring after an end of the processing of said one mounted sample using the plasma and before a start of the processing of another one of the plurality of samples using the plasma, by increasing an amount of a heat exchange medium supplied to one of the condenser and the vaporizer, and decreasing the amount of the heat exchange medium supplied to the other of the condenser and the vaporizer, in parallel, so as to change the temperature of the sample stage to another value suitable for starting the processing of said another one of the plurality of samples using the plasma at a second temperature condition, while the first and second expansion valves are maintained at a specific valve opening;
    starting processing of said another one of the plurality of samples; and
    regulating the opening and closing of the first and second expansion valves by increasing an opening degree of one of the first and second expansion valves and decreasing an opening degree of the other of the first and second expansion valves in parallel while regulating the refrigerant heat exchange amounts in both of the condenser and the vaporizer to a desired value in a predetermined range.

2. The plasma processing method according to claim 1, wherein said processing of said another one of said plurality of samples further comprises:
    performing each of a plurality of steps under one of at least the first temperature condition, the second condition, and a third temperature condition,
    wherein the step of regulating the opening and the closing of the first and second expansion valves in parallel while regulating the amount of the heat exchange amount of the condenser and the vaporizer is performed before a first one of said plurality of steps of said processing of said another one of said plurality of samples starts.

* * * * *